United States Patent
Shin et al.

(10) Patent No.: US 10,754,213 B2
(45) Date of Patent: Aug. 25, 2020

(54) THIN FILM TRANSISTOR SUBSTRATE

(71) Applicant: Samsung Display Co., Ltd, Yongin-si, Gyeonggi-do (KR)

(72) Inventors: Dong Hee Shin, Asan-si (KR); Kyung Ho Kim, Seongnam-si (KR); Ho Kyung Kim, Gwangju (KR); Yoo Mi Ra, Ansan-si (KR); Kee-Bum Park, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/046,576

(22) Filed: Feb. 18, 2016

(65) Prior Publication Data

US 2016/0320647 A1    Nov. 3, 2016

(30) Foreign Application Priority Data

Apr. 30, 2015   (KR) ........................ 10-2015-0062004

(51) Int. Cl.
*G02F 1/1362*    (2006.01)
*H01L 27/12*    (2006.01)
*G02F 1/1333*    (2006.01)

(52) U.S. Cl.
CPC ...... *G02F 1/136227* (2013.01); *H01L 27/124* (2013.01); *H01L 27/1218* (2013.01); *H01L 27/1222* (2013.01); *G02F 2001/133388* (2013.01); *G02F 2001/136222* (2013.01)

(58) Field of Classification Search
CPC ............... H01L 27/1222; H01L 27/124; G02F 2001/133388
See application file for complete search history.

(56) References Cited

U.S. PATENT DOCUMENTS

| | | | |
|---|---|---|---|
| 5,994,721 A * | 11/1999 | Zhong | G02F 1/136213 257/440 |
| 7,050,137 B2 | 5/2006 | Hoshino et al. | |
| 7,679,693 B2 | 3/2010 | Park | |
| 8,085,366 B2 * | 12/2011 | Chang | G02F 1/133514 349/106 |
| 8,169,569 B2 | 5/2012 | Kang et al. | |

(Continued)

FOREIGN PATENT DOCUMENTS

| | | |
|---|---|---|
| JP | 2001-265257 A | 9/2001 |
| KR | 10-2013-0018056 A | 2/2013 |
| KR | 10-2013-0030650 A | 3/2013 |

*Primary Examiner* — Edmond C Lau
*Assistant Examiner* — Jonathan Y Jung
(74) *Attorney, Agent, or Firm* — Innovation Counsel LLP

(57) ABSTRACT

Disclosed herein is a thin film transistor substrate, including: an insulating substrate having a dummy area and a display area; a signal line formed in the dummy area on the insulating substrate; a switching element positioned in the display area on the insulating substrate; a color filter layer positioned in the display area on the insulating substrate and exposing a portion of the switching element through at least one contact hole; and a dummy color filter layer positioned on the dummy area on the insulating substrate and exposing a portion of the signal line through at least one dummy contact hole, wherein the at least one dummy contact hole formed on the dummy color filter layer and the at least one contact hole formed on the color filter layer are formed on the same position in a plane view.

9 Claims, 7 Drawing Sheets

(56) References Cited

U.S. PATENT DOCUMENTS

| | | | |
|---|---|---|---|
| 2004/0105140 A1* | 6/2004 | Fujita | G02F 1/134309 |
| | | | 359/245 |
| 2007/0200992 A1* | 8/2007 | Kim | G02F 1/1362 |
| | | | 349/143 |
| 2010/0033646 A1* | 2/2010 | Baek | G02F 1/136209 |
| | | | 349/42 |
| 2010/0110359 A1* | 5/2010 | Lee | G02F 1/1345 |
| | | | 349/149 |
| 2011/0181816 A1* | 7/2011 | Kang | G02F 1/133345 |
| | | | 349/106 |
| 2012/0081640 A1* | 4/2012 | Kim | G02F 1/133514 |
| | | | 349/106 |

* cited by examiner

THIN FILM TRANSISTOR SUBSTRATE

CROSS-REFERENCE TO RELATED APPLICATION

This application claims priority to and the benefit of Korean Patent Application No. 10-2015-0062004 filed in the Korean Intellectual Property Office on Apr. 30, 2015, the entire contents of which are incorporated herein by reference.

BACKGROUND OF THE INVENTION (a) Field of the Invention

The present invention relates to a thin film transistor substrate.

(b) Description of the Related Art

A liquid crystal display (LCD) is one of the flat panel displays which have been most popular and is configured to include two sheets of display panels on which electrodes are formed and a liquid crystal layer interposed therebetween. The liquid crystal display (LCD) is a display device which applies a voltage to the electrodes to realign liquid crystal molecules of the liquid crystal layer, to thereby control the transmitted amount of light.

The currently most-used liquid crystal displays have a structure in which an electric field generating electrode is provided in two display panels, respectively. Among those, the mainstream of the liquid crystal display has a structure in which one display panel (hereinafter, referred to as 'thin film transistor array panel') is formed with a plurality of thin film transistors and pixel electrodes arranged in a matrix form and the other display panel (hereinafter, referred to as 'common electrode array panel') is formed with red, green, and blue color filters, and the whole surface of the display panel is covered with a common electrode.

However, the liquid crystal display has a problem of misalignment since it is difficult to accurately align between the pixel electrode and the color filters which are formed in different display panels.

To solve the above problem, a color filter on array (COA) structure in which a color filter and a pixel electrode are formed on the same display panel has been suggested. In the COA structure, a light blocking member called a black matrix and a color filter are formed on the same display panel as a pixel electrode.

Exposure and developing processes are carried out during manufacturing of the liquid crystal display to form a structure. However, a dummy area may be used during the formation of the structure at the time of carrying out the exposure and developing processes. For example, to form the color filter within the liquid crystal display, the dummy area formed of dummy pixels occurs at the left and right of the liquid crystal display at the time of performing a partition exposure process.

The above information disclosed in this Background section is only for enhancement of understanding of the background of the invention and therefore may contain information that does not form the prior art that is already known in this country to a person of ordinary skill in the art.

SUMMARY OF THE INVENTION

The present invention provides a thin film transistor substrate having the advantages of providing a panorama and large panel by using a dummy area generated during a manufacturing process of the thin film transistor substrate to secure a panel area.

An example embodiment of the present invention provides a thin film transistor substrate, including: an insulating substrate having a dummy area and a display area; a signal line formed in the dummy area on the insulating substrate; a switching element positioned in the display area on the insulating substrate; a color filter layer positioned in the display area on the insulating substrate and exposing a portion of the switching element through at least one contact hole; and a dummy color filter layer positioned on the dummy area on the insulating substrate and exposing a portion of the signal line through at least one dummy contact hole, wherein the at least one dummy contact hole formed on the dummy color filter layer and the at least one contact hole formed on the color filter layer are formed on the same position in a plane view.

The dummy area includes vertical dummy areas positioned at the left and right of the display area and the vertical dummy area may include a plurality of dummy pixels which are arranged in at least one column and are provided with different dummy color filters.

The display area may include a plurality of display pixels including the color filter layer provided with the switching element and the at least one contact hole and the display pixel may further include a pixel electrode which is formed over the color filter layer and contacts a portion of the switching element through the at least one contact hole formed in the color filter layer.

The display pixel may further include: an upper panel facing the insulating substrate; a liquid crystal layer positioned between the insulating substrate and the upper panel; and a common electrode positioned over the liquid crystal layer in the upper panel.

The dummy area may not include at least one of the thin film transistor, the pixel electrode, and the common electrode which are included in the display pixel.

A portion of a sustain electrode line in the signal line may be bridge-connected to the pixel electrode through the at least one dummy contact hole in the dummy area on the insulating substrate.

Open Short (OS) pads may be positioned under the dummy color filter in the dummy area on the insulating substrate and a bridge connection of the OS pads may be carried out using the at least one dummy contact hole formed in the dummy color filter.

The OS pads may be bridge-connected through at least one dummy contact hole which is formed on the dummy color filter layer of the first dummy pixel in which the OS pads are positioned.

The OS pads may be bridge-connected through the at least one dummy contact hole which is formed on the dummy color filter layer of a second dummy pixel adjacent to the first dummy pixel in which the OS pads are positioned.

At least two OS pads may be positioned under the dummy color filter layer of the first dummy pixel depending on the number of dummy contact holes formed on the dummy color filter layer of the second dummy pixel.

The dummy color filter layer may expose a portion of a diode through the at least one dummy contact hole.

According to an example embodiment of the present invention, it is possible to provide the thin film transistor substrate including the panorama and large panel by using the dummy area generated during the manufacturing process of the thin film transistor substrate to secure the panel area.

DETAILED DESCRIPTION OF THE EMBODIMENTS

Figure 1:
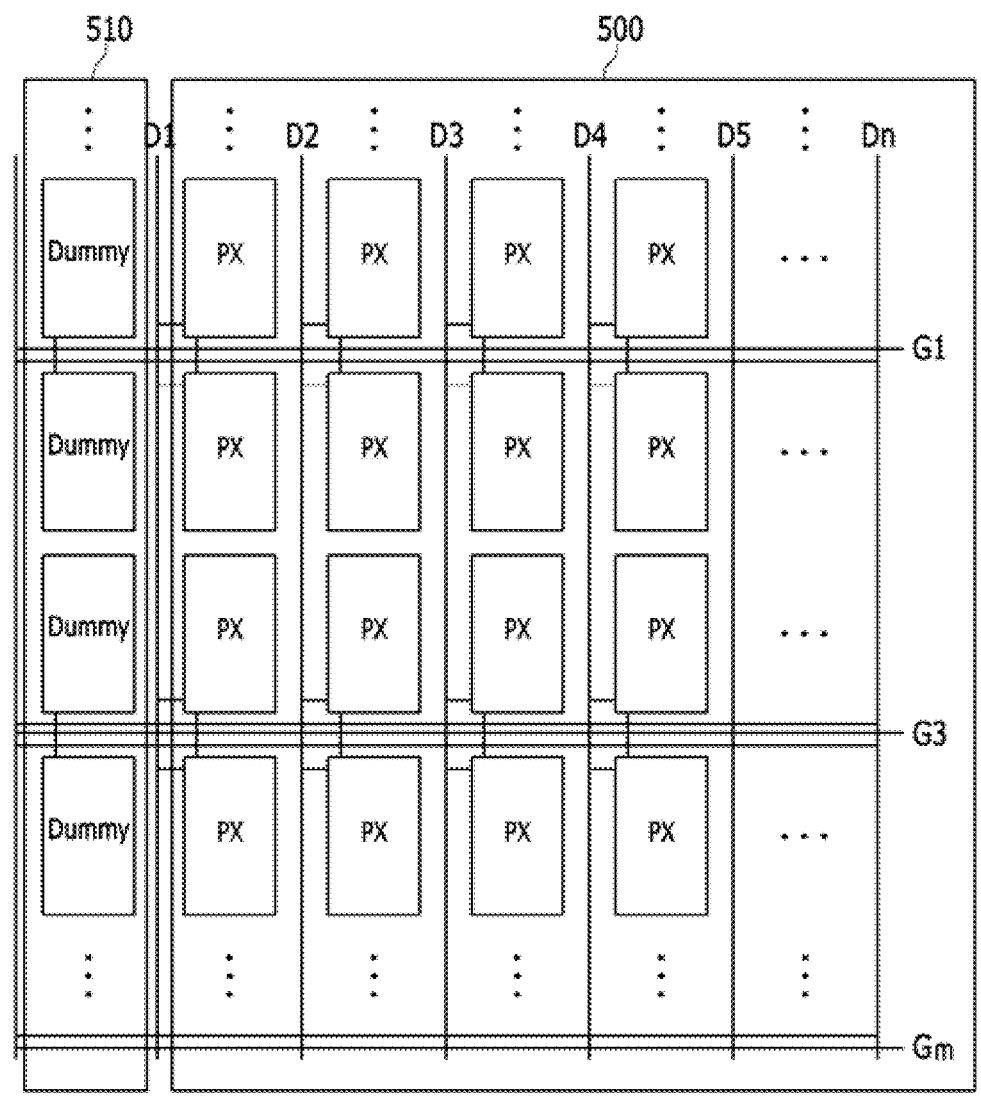
FIG. 1 is a layout view of a thin film transistor substrate according to an example embodiment of the present invention.

The present invention will be described more fully hereinafter with reference to the accompanying drawings, in which example embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 provides a layout view of a pixels on a thin film transistor substrate according to an example embodiment of the present invention.

FIG. 1 illustrates a layout of the thin film transistor substrate. A liquid crystal display according to an example embodiment of the present invention includes a thin film transistor array panel, a common electrode array panel facing the thin film transistor array panel, and a liquid crystal layer interposed therebetween, in which pixels are arranged on the thin film transistor array panel in a matrix arrangement. The thin film transistor array panel is based on an insulating substrate.

A plurality of gate lines and a plurality of data lines are sequentially formed on the insulating substrate. Gate lines G1, G2, . . . , Gm transfer a gate signal and mainly extend horizontally and data lines D1, D2, . . . , Dn transfer a data signal and mainly extend vertically to intersect with the gate lines G1, G2, . . . , Gm. Further, a light blocking member (not illustrated) is formed on the gate lines G1, G2, . . . , Gm and the data lines D1, D2, . . . , Dn and a color filter (not illustrated) is formed within a pixel area in which the light blocking member (not illustrated) is partitioned, thereby configuring pixels.

The pixels are divided into display pixels PX which display an image and dummy pixels which do not display an image.

The display pixels PX are positioned within a display area 500 and the dummy pixels are positioned at at least one side of an outer side of the display area 500.

According to the example embodiment of the present invention of FIG. 1, the dummy pixels may be formed over one or more of the outer sides of the display area 500. On the other hand, the dummy pixels may also be positioned only at one side of the display area 500.

The dummy pixels are positioned within a dummy area 510. The dummy area 510 may be formed in at least one of upper and lower areas or left and right areas of the display area 500, and therefore according to the example embodiment of the present invention, various dummy areas may be formed.

The dummy area 510 illustrated in FIG. 1 may include a plurality of dummy pixels which are arranged at least in a row and according to the example embodiment of the present invention, is configured of at least two rows or at least two columns of dummy pixels. For example, when the liquid crystal display is a device which provides a super-sized panorama with pixels over a dimension of about 100 inches, as a partition exposure process is carried out during a process of forming a color filter of the liquid crystal display, a plurality of columns of dummy pixels may be generated in vertical dummy areas 510 at the left and right of the display area 500.

The display pixel PX positioned in the display area 500 includes a thin film transistor, a pixel electrode, a common electrode, and a liquid crystal layer positioned in a space between the thin film transistor array panel and the common electrode array panel. The thin film transistor is formed on an insulating substrate and is connected to a gate line and a data line which intersect with each other while being insulated from each other. The remaining one terminal of the thin film transistor is connected to the pixel electrode. The color filter and the light blocking member may be positioned between the thin film transistor and the pixel electrode. The light blocking member may be positioned between adjacent pixels. Meanwhile, the color filter and the light blocking member may be formed under the pixel electrode and over the thin film transistor.

The dummy pixel is not a pixel displaying an image and therefore various structures thereof may possible. That is, the dummy pixel may not include at least one of the thin film transistor, the pixel electrode, the common electrode, and the liquid crystal layer which are included in the display pixel PX.

Meanwhile, the color filter and the light blocking member may be formed under the pixel electrode and over the thin film transistor. The dummy pixel may be formed like the laminar structure of the display pixel PX as described above, but may have a structure in which at least one of these components is removed. The reason is that the dummy pixel does not actually display the image.

Hereinafter, the structure of the display pixel PX according to the example embodiment of the present invention will be described with reference to FIGS. 2 and 3.

Figure 2:
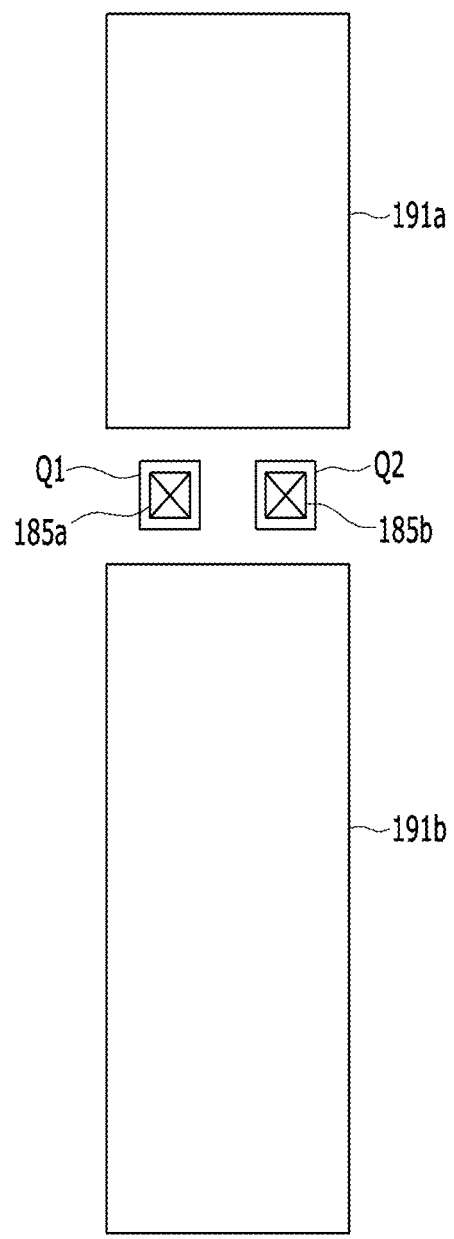
FIG. 2 is a detailed layout view of a display pixel PX in the thin film transistor substrate according to the example embodiment of the present invention.

FIG. 2 provides a detailed layout view of the display pixel PX in the thin film transistor substrate according to the example embodiment of the present invention.

The thin film transistor substrate of the display device includes a plurality of pixels and a plurality of signal lines.

A signal line may include the gate line, the data line, a voltage division reference voltage line, a sustain electrode line, etc.

Referring to FIG. 2, one pixel of the thin film transistor substrate may include a plurality of pixel electrodes and a plurality of switching elements Q1 and Q2.

For example, in order to implement a wide viewing angle in the liquid crystal display, a plurality of domains having different alignment directions of the liquid crystal may be formed in one pixel. To form the plurality of domains, a plurality of pixel electrodes 191a and 191b may be formed within one pixel.

The switching elements Q1 and Q2 are elements of the thin film transistor, etc., and each of the switching elements Q1 and Q2 may be connected to at least one of the corresponding signal lines, the pixel electrodes 191a and 191b, and input and output terminals of the switching elements Q1 and Q2. The switching elements Q1 and Q2 may be turned on/off depending on a signal applied to the signal line. The corresponding voltage may be applied to the pixel electrodes 191a and 191b depending on an operation of the switching elements Q1 and Q2.

In this case, the input terminal or the output terminal of the switching elements Q1 and Q2 and the pixel electrodes 191a and 191b may be formed on different layers. For example, when the switching elements Q1 and Q2 of the thin film transistor are formed, a layer on which a drain of switching elements Q1 and Q2 is formed and a layer on which the pixel electrodes 191a and 191b are formed may be formed as different layers. Further, a color filter layer, a passivation layer, etc., may be formed on the layer on which the drain of switching elements Q1 and Q2 is formed and the layer on which the pixel electrodes 191a and 191b are formed.

Therefore, the switching elements Q1 and Q2 may be connected to the pixel electrodes, etc., through contact holes 185a and 185b. To connect between the pixel electrodes and the input and output terminals of the switching elements Q1 and Q2, the contact holes 185a and 185b are formed on a layer formed over the switching elements Q1 and Q2 and thus the pixel electrode is directly connected to the input terminal or the output terminal of the switching elements Q1 and Q2 which are exposed through the contact holes 185a and 185b.

In this case, the color filter layer may be formed to be provided with the contact holes 185a and 185b through which the input terminal and the output terminal of the switching elements Q1 and Q2 are exposed. The exposure and developing processes may be carried out to form the color filter layer. As a method of forming the color filter layer, various methods may be used. For example, in the case of the liquid crystal display providing the super-sized panorama with pixels over a dimension of about 100 inches, the color filter of the liquid crystal display may be formed using the partition exposure process.

In the case of using the partition exposure process, at least one of the dummy pixels may be additionally generated at the outer portion of the display area in which the display pixels are positioned.

Figure 3:
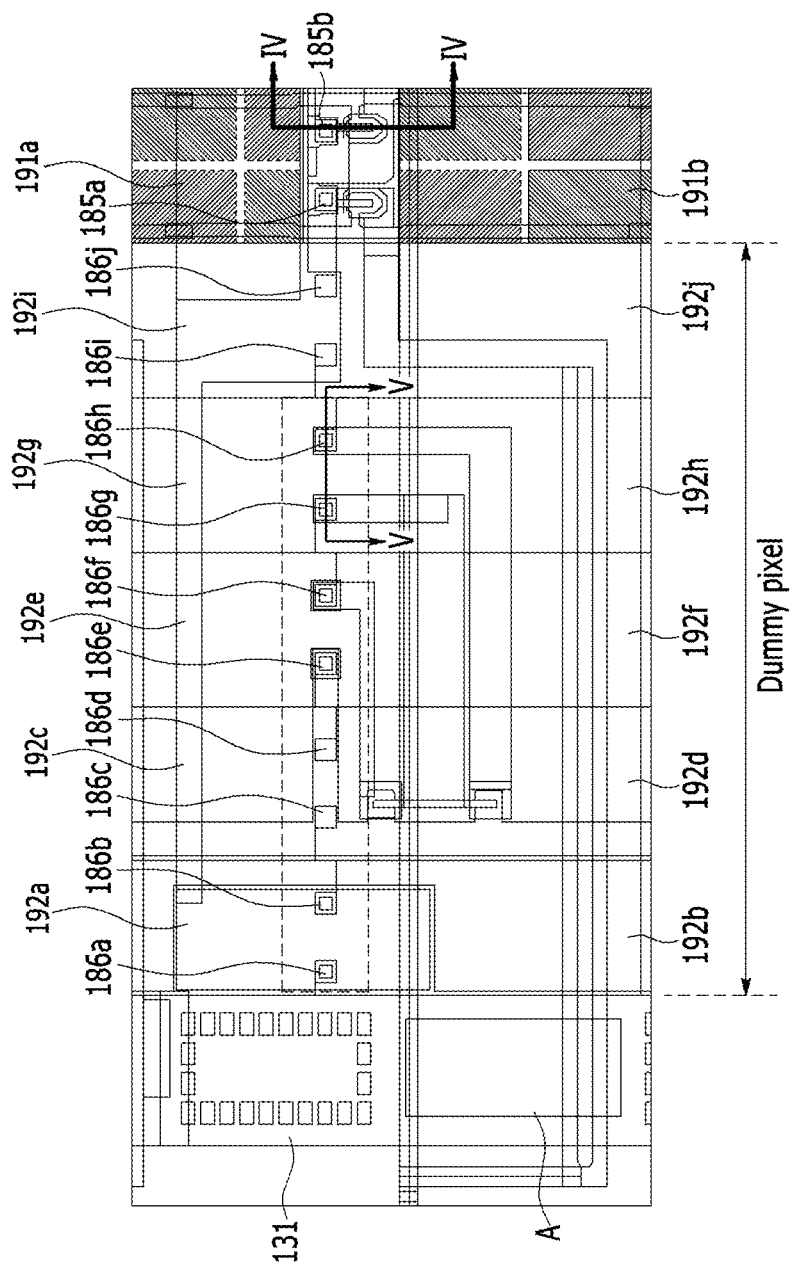
FIG. 3 is a plan view illustrating the thin film transistor substrate according to the example embodiment of the present invention.

FIG. 3 is a plan view illustrating the thin film transistor substrate according to the example embodiment of the present invention.

As illustrated in FIG. 3, the display pixel and a plurality of pixels including the dummy pixel may be provided with the color filter to express at least one primary color of red, green, and blue.

Further, each pixel may be provided with at least one contact hole. The contact hole may be formed to be enclosed with the color filter layers corresponding to at least two of the primary colors.

For example, the display pixel having pixel electrodes 191a and 191b of the display area may be provided with at least one contact hole 185a and 185b. Further, the dummy pixels having electrodes 192a, 192b, 192c, 192d, 192e, 192f, 192g, 192h, 192i, and 192j of the dummy area may be provided with at least one dummy contact hole 186a, 186b, 186c, 186d, 186e, 186f, 186g, 186h, 186i, and 186j. An edge of the dummy area is provided with the sustain electrode line 131.

As described above, at least one contact hole 185a and 185b which are formed in the display pixel having pixel electrodes 191a and 191b of the display area connects the switching elements Q1 and Q2 to the pixel electrode, etc.

On the other hand, at least one dummy contact hole 186a, 186b, 186c, 186d, 186e, 186f, 186g, 186h, 186i, and 186j which are included in the dummy pixel electrodes 192a, 192b, 192c, 192d, 192e, 192f, 192g, 192h, 192i, and 192j may be utilized for other purposes besides a purpose for the switching element and the pixel electrode. For example, the dummy contact holes 186a, 186b, 186c, 186d, 186e, 186f, 186g, 186h, 186i, and 186j may be used as a bridge connecting path or a diode connecting path between the sustain electrode line 131 formed at an edge of the dummy pixel and the pixel electrode 191 in the display area.

Hereinafter, the structure of the thin film transistor substrate including the display pixel and the dummy pixel illustrated in FIG. 3 will be described with reference to FIGS. 4 and 5.

Figure 4:
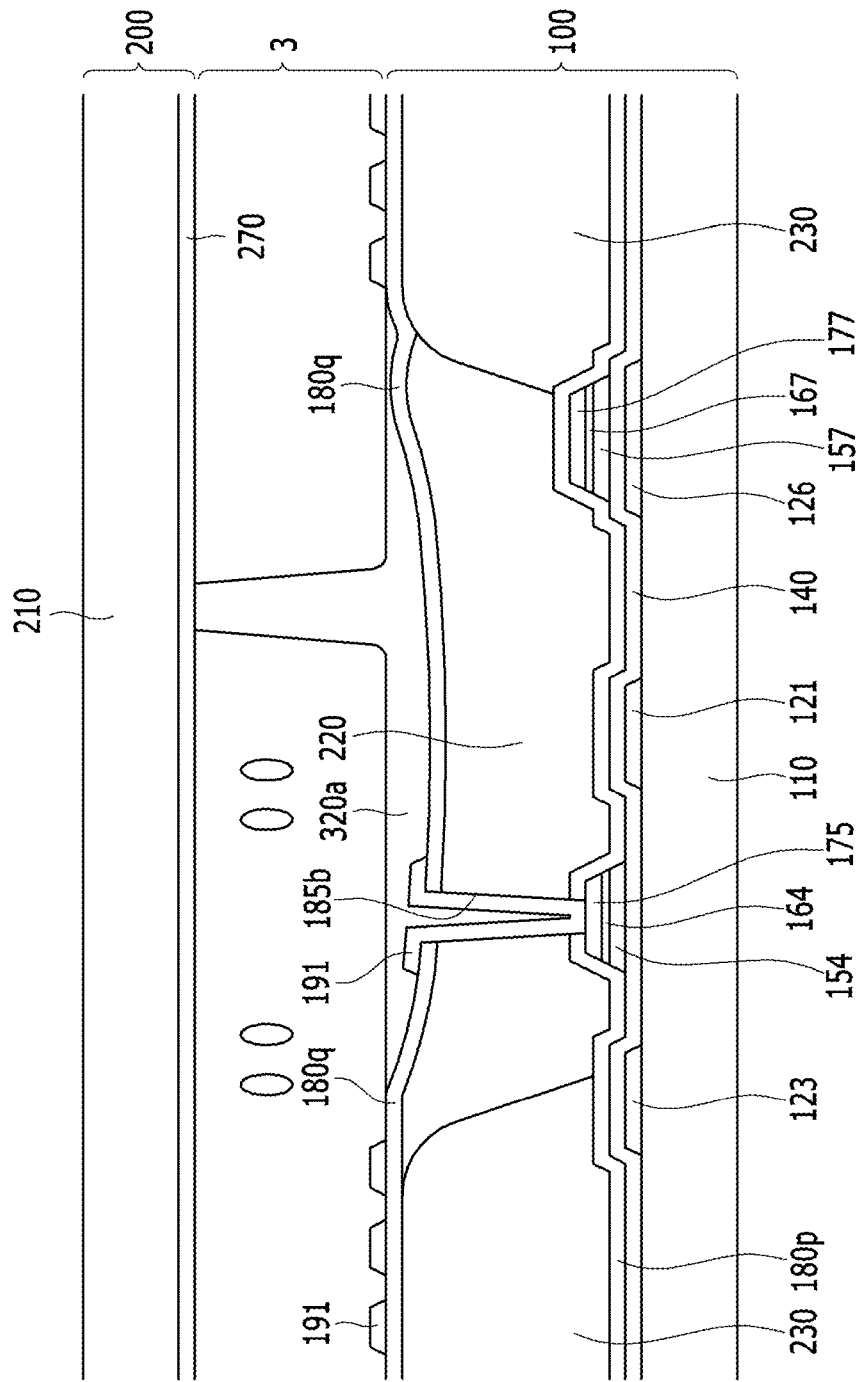
FIG. 4 is a cross-sectional view of the thin film transistor substrate of FIG. 3 taken along the line IV-IV of FIG. 3.
Figure 5:
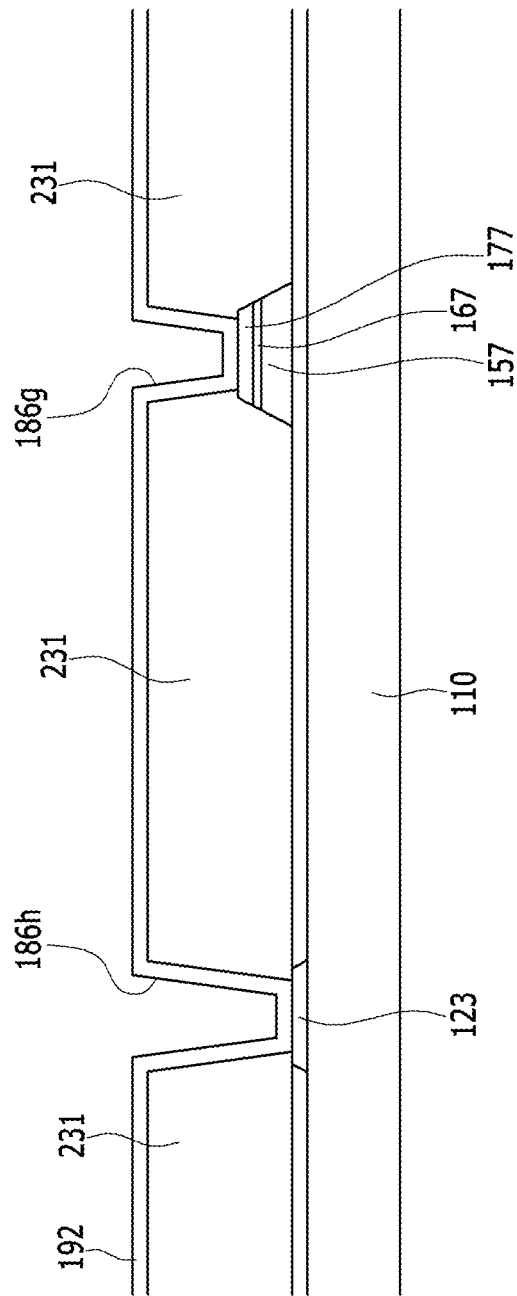
FIG. 5 is a cross-sectional view of the thin film transistor substrate of FIG. 3 taken along the line V-V of FIG. 3.

FIG. 4 is a cross-sectional view of the thin film transistor substrate of FIG. 3 taken along the line IV-IV and FIG. 5 is a cross-sectional view of the thin film transistor substrate of FIG. 3 taken along the line V-V.

Referring to FIGS. 3 and 4, a plurality of gate conductors which include the plurality of gate lines 121, a plurality of step down gate lines 123, and the sustain electrode lines (not illustrated) are formed on the thin film transistor substrate in the display area of insulating substrate 110.

The gate line 121 and the step down gate line 123 mainly extend in a horizontal direction and transfer the gate signal. The sustain electrode line (not illustrated) transfers a defined voltage such as a common voltage Vcom, etc. The sustain electrode line (not illustrated) mainly extends in a horizontal direction but includes the sustain electrode protruding upward and downward, a pair of vertical parts which extend downward while being approximately vertical to gate line 121, and a pair of horizontal parts connecting between ends of the pair of vertical parts, in which the horizontal part includes a capacitance electrode 126 extending downward.

A gate insulating layer 140 is formed on the gate conductors 121, 123, and 126.

A plurality of linear semiconductors 154 and 157 which may be made of amorphous silicon, crystalline silicone, or the like, are formed on the gate insulating layer 140. A plurality of linear ohmic contacts 164 and 167 are formed on the linear semiconductors 154 and 157, respectively.

The data conductors including the plurality of data lines and a plurality of drain electrodes 175 which transfer data signals and mainly extend in a vertical direction to intersect with the gate lines 121 and 123 are formed on the ohmic contacts 164 and 167.

The data line (not illustrated) transfers the data signal and mainly extends in a vertical direction to intersect with the gate line 121 and the step down gate line 123. Each data line (not illustrated) includes a plurality of source electrodes (not illustrated).

The gate electrode, the source electrode, and the drain electrode form the single thin film transistors Q1 and Q2 along with a semiconductor island and a channel of the thin film transistor are formed in each semiconductor between each source electrode and each drain electrode.

A linear semiconductor includes the semiconductors 154 and 157 that have substantially the same planar shape as data conductors 175 and 177 and the ohmic contacts 164 and 167 thereunder, except for a channel area between the source electrode 177 and the drain electrode 175. That is, the linear semiconductor including the semiconductor 154 has an exposed portion, without being covered with the data conductor 175.

A lower passivation layer 180p which may be made of inorganic insulating materials like silicon nitride or silicon oxide is formed on the data conductors 175 and 177 and the exposed portion of the semiconductors 154 and 157.

A color filter 230 is formed on the lower passivation layer 180p. The color filters 230 are positioned in most areas except for the place where the plurality of thin film transistors are positioned and each color filter 230 may display one of three primary colors such as red, green, and blue.

The light blocking member 220 may be positioned on an area in which the color filter 230 is not positioned, but may overlie a portion of the color filter 230. The light blocking member 220 is referred to as a black matrix and prevents light leakage. The light blocking member 220 extends upward and downward along the gate line 121 and the step down gate line 123 and a height of a portion of the light blocking member 220 may be lower than that of the color filter 230.

An upper passivation layer 180q is formed on the color filter 230 and the light blocking member 220. The upper passivation layer 180q prevents the color filter 230 and the light blocking member 220 from lifting or delaminating and suppresses contamination of the liquid crystal layer 3 due to organic materials, such as a solvent inflowing from the color filter 230, thereby preventing defects, such as an afterimage which may occur at the time of driving the screen, from occurring.

The lower passivation layer 180p, the light blocking member 220 and the upper passivation layer 180q are provided with the plurality of contact holes 185a and 185b through which a wide end of the drain electrode 175 is exposed. The color filters corresponding to at least two of the primary colors may be formed around the plurality of contact holes 185a and 185b.

A plurality of pixel electrodes 191 are formed on the upper passivation layer 180q.

The plurality of pixel electrodes 191 each are physically and electrically connected to the drain electrode 175 through the contact holes 185a and 185b and may be applied with a data voltage from the drain electrode 175.

The pixel electrode 191 to which the data voltage is applied generates an electric field along with the common electrode 270 of the upper panel 200 to determine an alignment of liquid crystal molecules of the liquid crystal layer 3 between the two electrodes 191 and 270. The luminance of light passing through the liquid crystal layer 3 is changed, determined by the alignment of the liquid crystal molecules, as described above.

The upper panel 200 includes the insulating substrate 210 made of transparent glass, plastic, or the like and the common electrode 270.

A colored member 320a is formed on the upper passivation layer 180q. The colored member 320a is disposed on the light blocking member 220. The colored member 320a is formed according to the gate line 121 and a step-down gate line 123 and expands upward and downward.

Next, the structure of the thin film transistor substrate including the dummy pixel formed in the dummy area will be described with reference to FIGS. 3 and 5.

Referring again to FIG. 3, any dummy contact holes 186a, 186b, 186e, 186f, 186g, and 186h of the dummy contact holes 186a, 186b, 186c, 186d, 186e, 186f, 186g, 186h, 186i, and 186j may be selected, which may be used as a bridge connection path of the sustain electrode line 131 or a bridge connection path of the diode.

A cross-section for the dummy pixel including a first dummy contact hole 186g and a second dummy contact hole 186h of the dummy contact holes 186a, 186b, 186e, 186f, 186g, and 186h which are used as the bridge connection path may be illustrated as in FIG. 5.

Referring to FIG. 5, at least one dummy contact hole 186g and 186h is also formed in the dummy pixel having electrodes 192g and 192h which are formed on the insulating substrate 110 in the dummy area. In this case, at least one dummy contact hole 186g and 186h may be used as a bridge connection path of the sustain electrode line 131 or a diode bridge.

For example, in the case of the first dummy contact hole 186g, the data conductor in which the linear semiconductor 157, the linear ohmic contact 167, and the drain electrode 177 are sequentially stacked is formed on the insulating substrate 110 at the position at which the first dummy contact hole 186g is formed. The gate line 123 is formed on the insulating substrate 110 at the position at which the second dummy contact hole 186h is formed.

A dummy color filter 231 is formed over the insulating substrate, the gate line 123, and the data conductor. The dummy color filter 231 may display one of three primary colors.

A dummy electrode 192 is formed on the dummy color filter 231 and the gate line 123 and the drain electrode 177 which are exposed through the dummy contact holes 186g and 186h.

Therefore, the dummy electrode 192 may serve as the bridge of the sustain electrode line 131 formed at the outer portion of the dummy area through the dummy contact holes 186g and 186h or may be used as the contact hole for the diode connection.

Further, the dummy contact hole according to the example embodiment of the present invention may be used as a bridge contact hole for an open short (OS) pad.

Figure 6:
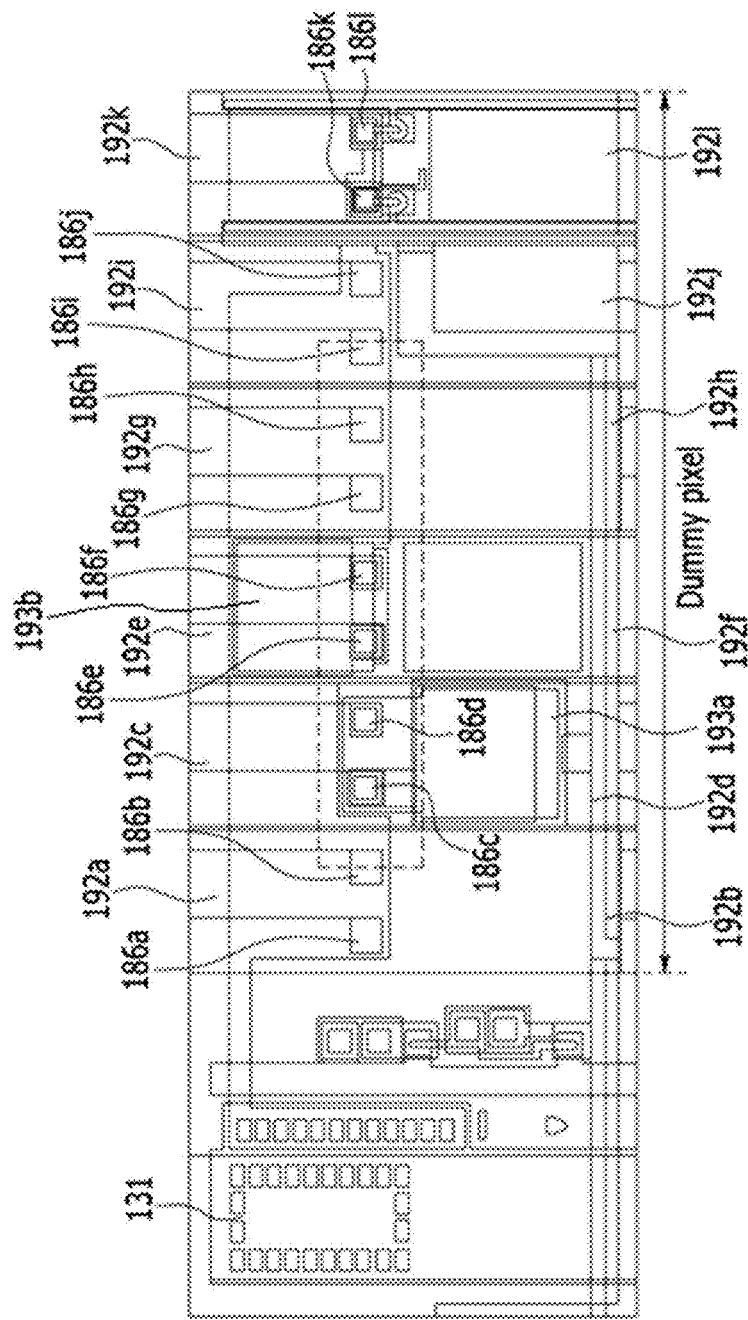
FIG. 6 is a diagram illustrating an example of the thin film transistor substrate including a dummy pixel according to an example embodiment of the present invention.
Figure 7:
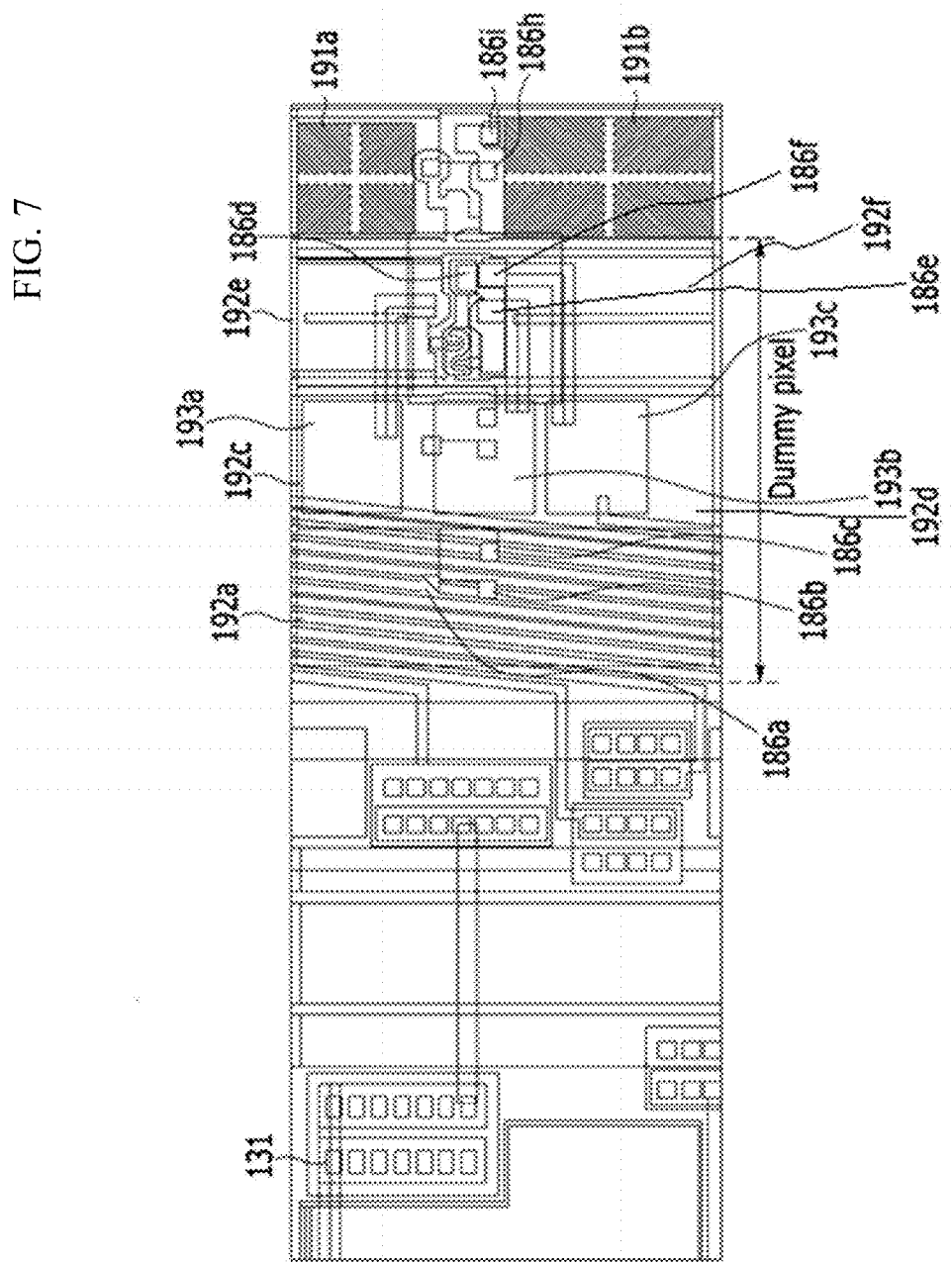
FIG. 7 is a diagram illustrating another example of the thin film transistor substrate including the dummy pixel according to an example embodiment of the present invention.

FIGS. 6 and 7 are diagrams illustrating additional examples of the thin film transistor substrate including the dummy pixel according to an example embodiment of the present invention.

Referring to FIG. 6, a portion of at least one dummy pixel having electrodes 192a, 192b, 192c, 192d, 192e, and 192f may be provided with at least one of open short (OS) pads 193a and 193b. In this case, the dummy contact holes 186c, 186d, 186e, and 186f formed in the dummy pixel electrodes 192c, 192d, 192e, and 192f, respectively, in which the OS pads 193a and 193b are disposed may be each used as the contact hole bridge of the OS pads 193a and 193b. That is, the first OS pad 193a may be disposed under the first pair of dummy pixel electrodes 192c and 192d by using the dummy contact holes 186c and 186d of the first pair of dummy pixel electrodes 192c and 192d as the bridge. Further, the second OS pad 193b may be disposed under the second pair of dummy pixel electrodes 192e and 192f by using the dummy contact holes 186e and 186f of the second pair of dummy pixel electrodes 192e and 192f as the bridge.

The form in which the OS pads 193a and 193b are disposed may be implemented so that at least one OS pad is disposed under different dummy pixels as illustrated in FIG. 6.

Alternatively, as illustrated in FIG. 7, at least one OS pad 193a, 193b, and 193c may be disposed in one dummy pixel having electrodes 192c and 192d. In this case, at least one dummy contact hole 186a, 186b, and 186c which is formed in one dummy pixel may be used as the bridge connection path of the OS pads 193a, 193b, and 193c and at the time of the bridge connection, one dummy contact hole may be used.

That is, the plurality of OS pads 193a, 193b, and 193c may be disposed under the second dummy pixels 192c and 192d adjacent to the first dummy pixels 192e and 192f by using each of the plurality of dummy contact holes 186d, 186e, and 186f which are formed in the first dummy pixels 192e and 192f as the bridge.

FIGS. 6 and 7 are diagrams for describing example embodiments of bridge-connecting the OS pads using the dummy contact holes, but the example embodiments of the present invention is not limited thereto. Therefore, the connection form of the OS pads may be variable depending on the position and number of dummy contact holes which are formed in one pixel.

Further, referring to FIG. 3, an area A for opening the light blocking member is separately designed over the lower metal layer in the substrate on which the dummy pixel is formed through which to irradiate UV.

Therefore, the foregoing detailed description is not to be restrictively construed in all aspects but should be reckoned as being examples. The scope of the present invention is to be determined by a reasonable interpretation of the appending claims and all the changes within an equivalent range of the present invention are included in the scope of the present invention.

<Description of symbols>

| | |
|---|---|
| Q1, Q2: Switching element (thin film transistor) | |
| 110, 210: Substrate | 121, 123: Gate line |
| 140: Gate insulating layer | 154: Semiconductor |
| 164, 167: Ohmic contact | 175: Drain electrode |
| 180p, 180q: Passivation layer | 185a, 185b: Contact hole |
| 186a to 186j: Dummy contact hole | |
| 191a, 191b: Display pixel electrodes | 192a to 192j: Dummy pixel electrodes |
| 220: Light blocking member | 230: Color filter |

What is claimed is:

1. A thin film transistor substrate, comprising:
an insulating substrate having a dummy area including a plurality of dummy pixels arranged in a plurality of rows and columns, and a display area including a plurality of display pixels arranged in a plurality of rows and columns;
a first conductor disposed in the dummy area on the insulating substrate;
a second conductor disposed in the dummy area and in a different layer on the insulating substrate from the first conductor;
switching elements positioned in the display area on the insulating substrate;
a color filter layer positioned in the display area on the insulating substrate and including contact holes disposed on a portion of the switching elements;
a dummy color filter layer positioned on the dummy area on the insulating substrate and including dummy contact holes; and
a dummy electrode disposed on the dummy color filter layer,
wherein:
a first dummy pixel of the plurality of dummy pixels comprises a first dummy contact hole and a second dummy contact hole of the dummy contact holes,
a first display pixel of the plurality of display pixels comprises a first contact hole and a second contact hole of the contact holes,
the dummy electrode is electrically connected to and contacts the first conductor through the first dummy contact hole and electrically connected to and contacts the second conductor through the second dummy contact hole,
the first dummy contact hole and the second dummy contact hole are arranged in a first direction in the first dummy pixel,
the first contact hole and the second contact hole are arranged in the first direction in the first display pixel, and
the first dummy contact hole and the second dummy contact hole in the first dummy pixel are aligned along the first direction with the first contact hole and the second contact hole in the first display pixel.

2. The thin film transistor substrate of claim 1, wherein:
the at least one dummy contact hole of the dummy pixel and the at least one contact hole of the display pixel in a same row are aligned in a same line as each other.

3. The thin film transistor substrate of claim 2, wherein:
the display pixel further includes a pixel electrode which is formed over the color filter layer and contacts the portion of the switching element through the at least one contact hole of the color filter layer.

4. The thin film transistor substrate of claim 3, wherein:
the display pixel further includes:
an upper panel facing the insulating substrate;
a liquid crystal layer positioned between the insulating substrate and the upper panel; and
a common electrode positioned in the upper panel.

5. The thin film transistor substrate of claim 4, wherein the dummy pixel does not include at least one of a thin film transistor or the common electrode.

6. The thin film transistor substrate of claim 3, wherein the first conductor comprises a sustain electrode line configured to transmit a predetermined voltage including a common voltage.

7. The thin film transistor substrate of claim 3, further comprising:
open short pads positioned under the dummy color filter in the dummy area.

8. The thin film transistor substrate of claim 7, wherein two or more of the open short pads are disposed in one dummy pixel of the plurality of dummy pixels.

9. The thin film transistor substrate of claim 3, wherein the first conductor comprises a gate line configured to transmit a gate signal.

* * * * *